United States Patent
Lee

(10) Patent No.: US 7,253,071 B2
(45) Date of Patent: Aug. 7, 2007

(54) METHODS FOR ENHANCING THE FORMATION OF NICKEL MONO-SILICIDE BY REDUCING THE FORMATION OF NICKEL DI-SILICIDE

(75) Inventor: Tan-Chen Lee, Panchiao (TW)

(73) Assignee: Taiwan Semiconductor Manufacturing Company (TW)

( * ) Notice: Subject to any disclaimer, the term of this patent is extended or adjusted under 35 U.S.C. 154(b) by 103 days.

(21) Appl. No.: 11/075,140

(22) Filed: Mar. 7, 2005

(65) Prior Publication Data

US 2005/0272215 A1     Dec. 8, 2005

Related U.S. Application Data

(60) Provisional application No. 60/576,559, filed on Jun. 2, 2004.

(51) Int. Cl.
*H01L 21/331* (2006.01)

(52) U.S. Cl. ................ 438/369; 438/301; 257/272

(58) Field of Classification Search ................ 438/301, 438/303, 369, 592; 257/272, 368, 384, 389
See application file for complete search history.

(56) References Cited

U.S. PATENT DOCUMENTS

| | | | | |
|---|---|---|---|---|
| 4,137,103 A | * | 1/1979 | Mader et al. | 148/33 |
| 6,380,057 B1 | * | 4/2002 | Buynoski et al. | 438/592 |
| 7,098,094 B2 | * | 8/2006 | Lu | 438/199 |
| 7,119,404 B2 | * | 10/2006 | Chang et al. | 257/389 |

* cited by examiner

*Primary Examiner*—Phuc T. Dang
(74) *Attorney, Agent, or Firm*—Duane Morris, LLP

(57) ABSTRACT

Methods for reducing stress in silicon to enhance the formation of nickel mono-silicide films formed thereon include a strain compensation source/drain implant process, a silicide formation process on an amorphous silicon layer, a strain compensating buried layer process, a strain compensating dielectric capping layer process during silicide formation, a two cycle anneal process during silicide formation, an excess nickel process to transform $NiSi_2$ to NiSi.

10 Claims, 9 Drawing Sheets

METHODS FOR ENHANCING THE FORMATION OF NICKEL MONO-SILICIDE BY REDUCING THE FORMATION OF NICKEL DI-SILICIDE

RELATED APPLICATIONS

This application claims the benefit of U.S. Provisional Application No. 60/576,559, filed on Jun. 2, 2004, the entire disclosure of which is incorporated herein by reference.

FIELD OF THE INVENTION

The present invention relates to integrated circuit and semiconductor device fabrication and, more particularly, to methods for reducing stress in silicon to enhance the formation of nickel mono-silicide films formed thereon.

BACKGROUND OF THE INVENTION

Self-aligned silicide (salicide) technology is required in modern integrated circuit and semiconductor device fabrication to lower the resistance of polysilicon gates, sources and drains to reduce RC delay, i.e., the gate speed performance index wherein less delay produces increased gate speed performance. An example of a well known silicide technology is cobalt silicide ($CoSi_2$). $CoSi_2$ technology is commonly used for sub quarter micron and beyond technology. However, the agglomeration effect of $CoSi_2$ on very narrow line polysilicon gates that are less than ~42 nanometers, often limits its extendibility to the fabrication of shorter gates.

Nickel mono-silicide (NiSi) technology appears to be emerging as a dominant solution to very narrow line polysilicon gates because it provides superior sheet resistance (Rs) for narrow line polysilicon gates, less junction leakage, less silicon (Si) consumption, and can even improve the drive current (Idsat) of an NFET or PFET.

There are, however, some concerns about NiSi because it may not form completely or at all when the single crystal Si or Si containing substrate is under tensile stress and instead, undesirable nickel di-silicide ($NiSi_2$) forms. $NiSi_2$ is undesirable because it increases the resistance of the silicide. Moreover, faceted $NiSi_2$ may form deeply in the Si substrate thereby producing junction leakage. In addition, $NiSi_2$ can easily form over a wide temperature range. For example, Ni will form epitaxial $NiSi_2$ on a p-type Si crystal substrate as low as 225° C., which decreases the process window.

The tensile stress in the single crystal Si or Si containing substrate may be due to the p-type dopant atoms in the substrate. For example, boron is commonly used as a p-type dopant atom in Si. Boron has a smaller atomic radius than Si, which causes strain in the Si crystal lattice. Tensile stress in Si may also be due to geometry and thermal effects.

Accordingly, methods are needed which allow NiSi to be implemented successfully in modern integrated circuit and semiconductor device fabrication.

DETAILED DESCRIPTION OF THE INVENTION

Figure 1A:
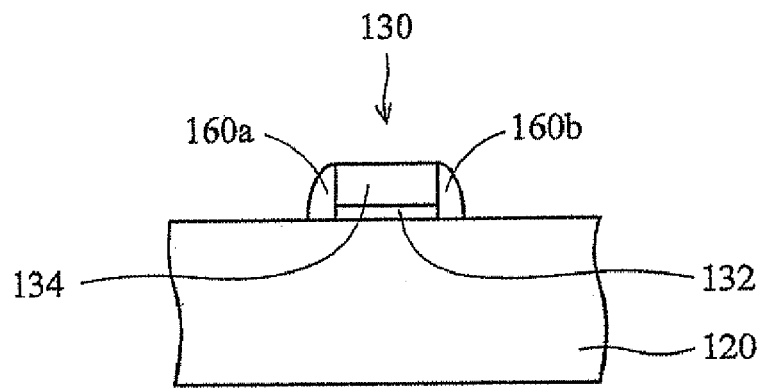
FIGS. 1A-1C are sectional views illustrating a first method of fabricating a PMOS semiconductor device according to the present invention.
Figure 1B:
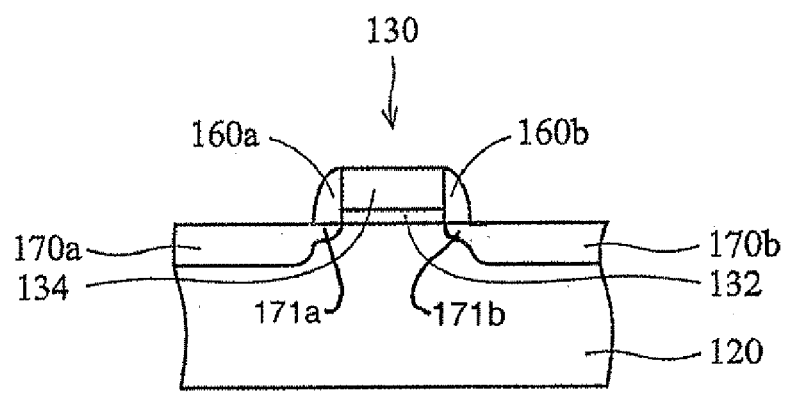
Figure 1C:
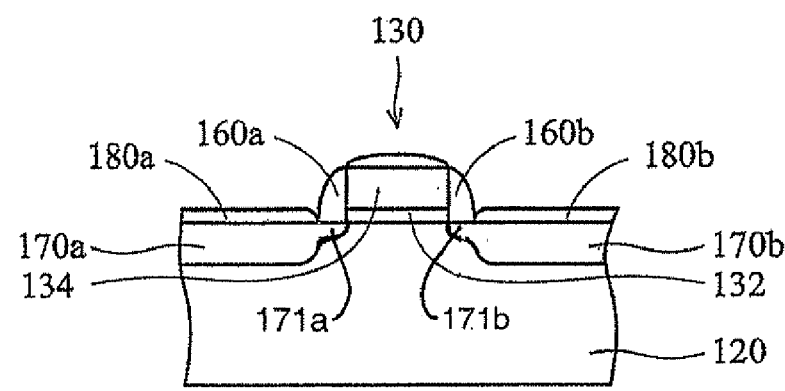

FIGS. 1A-1C are sectional views illustrating a method of fabricating an N- or P-MOS semiconductor device according to the present invention. As illustrated in FIG. 1A, the method commences with the formation of a gate structure 130 over a p- or n-type single crystal Si substrate 120 or any other substrate containing Si such as SiGe, followed by the formation of first and second non-conductive spacers 160a, 160b along opposing side walls of the gate structure 130. The gate structure 130 (and the other gate structures referred to further on) may include a gate oxide 132, such as silicon dioxide ($SiO_2$), disposed over the substrate 120 and a gate conductor 134, such as polysilicon, disposed over the gate oxide 132. The gate structure 130 may be formed using conventional methods well known in the art. The spacers 160a, 160b may be composed, for example, of a conventionally fabricated oxide or nitride layer.

A source/drain implantation process is performed to form self-aligned first and second p+ source/drain regions 170a and 170b in the substrate 120. The source/drain ion implantation process may be performed conventionally using a p-type dopant such as B and $BF_2$. LDD (lightly doped drain) areas in the case of a PMOS device (shown) or a halo implant area in the case of an NMOS device, are formed as part of source/drain extensions 171a and 171b with a p-type dopant, before the spacer or after the source/drain process. Note that the "source/drain region" is used herein to refer to a source/drain region and/or a source/drain extension region.

The B or $BF_2$ implant at the source/drain regions of the substrate increases the tensile stress of the Si or substrate containing Si, because a B atom has an atomic radius that is much smaller than the atomic radius of an Si atom. The tensile stress or strain may be compensated for, according to the present invention, by implanting additional atoms at the source/drain regions which have atomic radii that are greater than the atomic radius of the Si atom and which are capable of maintaining the p+ conductivity. Such atoms may be the atoms of one or more Group IV elements, Group II elements, and Group III elements, and combinations thereof. The strain compensation implantation process may be performed either before or after the source/drain implantation process. FIG. 1B depicts the device after the source/drain and strain compensation implantations.

Figure 2A:
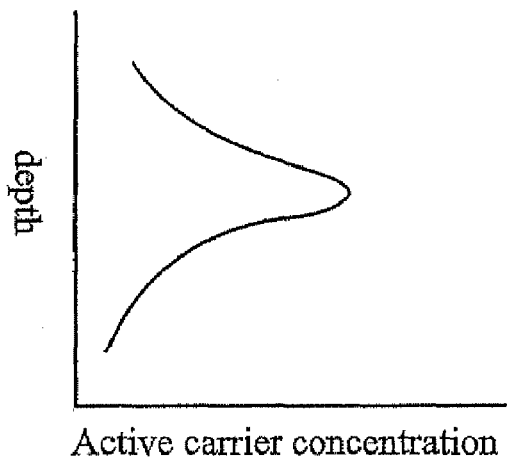
FIG. 2A is a graph showing active carrier concentration versus implantation depth without a strain compensation implant.
Figure 2B:
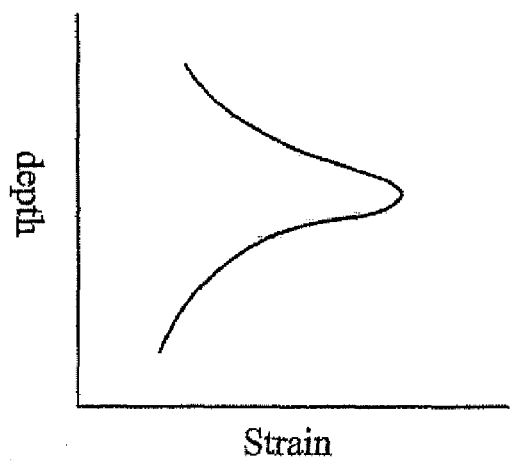
FIG. 2B is a graph showing strain versus depth of implantation without strain compensation.
Figure 3A:
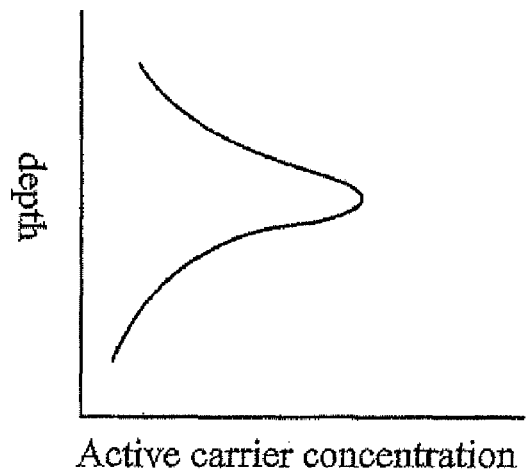
FIG. 3A is a graph showing active carrier concentration versus implantation depth after performing the strain compensation implant of the present invention.
Figure 3B:
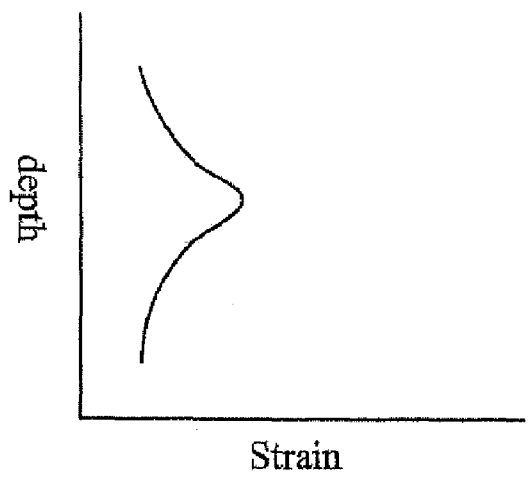
FIG. 3B is a graph showing strain versus depth of implantation strain compensation.

In order to maintain proper device function, the active carrier concentration and profile should be the substantially same after performing the strain compensation implant of the present invention as shown graphically in FIG. 2A and FIG. 3A. Specifically, FIG. 2A shows the active carrier concentration versus implantation depth without a strain compensation implant, and FIG. 3A shows substantially the same active carrier concentration versus implantation depth after performing the strain compensation implant of the present invention. As can be seen in FIGS. 2B and 3B, which graphically show strain versus depth of implantation without strain compensation (FIG. 2B) and with strain compensation (FIG. 3B), the strain compensation implant of the present invention significantly reduces the strain in the source/drain regions of the substrate. One of ordinary skill in the art will appreciate that the strain in the source/drain regions of the substrate does not have to be completely compensated to achieve nickel mono-silicide enhancement.

The active carrier concentration and profile may be maintained with the strain compensation implant of the present invention by adjusting the B or $BF_2$ source/drain implant dosage and the group II/III/IV element(s) strain compensation implant dosage according to the size of their atomic radii. For example, if the B or $BF_2$ source/drain implant dosage is about $3 \times 10^{15}/cm^2$ without strain compensation, then the total active carrier source/drain dosage with the strain compensation implant may be calculated as follows in the below examples:

For B and group IV Ge:
Atomic radii of the atoms are: $R_{Ge}$=1.22 Å, $R_{Si}$=1.11 Å, $R_B$=0.8 Å
$R_{Si} = C * R_B + (1-C) * R_{Ge}$
C=0.26 where C is a preselected concentration ratio that allows the correct ratio of source/drain dopant to strain relief dopant
Dose (Ge): Dose (B)=$(0.74)^3$: $(0.26)^3 \cong 23:1$
Total active carrier source/drain dosage=Dose (Ge)+Dose (B)

For B and group III In:
Atomic radii of the atoms are: $R_{In}$=1.44 Å, $R_{Si}$=1.11 Å, $R_B$=0.8 Å
$R_{Si} = C * R_B + (1-C) * R_{In}$
C=0.516
Dose (In):Dose (B)=$(0.484)^3$:$(0.516)^3 \cong 0.83:1$
Total active carrier source/drain dosage=Dose (In)+Dose (B)

For B and group III In and group V Sb combination:
Atomic radii of the atoms are: $R_{In}$=1.44 Å, $R_{Sb}$=1.40 Å, $R_{Si}$=1.11 Å,
$R_B$=0.8 Å
$R_{Si} = C * R_{In} + C * R_{Sb} + (1-2C) * R_B$
C=0.25
Dose(In):Dose (Sb):Dose(B)$\cong$1:1:8
Total active carrier source/drain dosage=Dose (In)+Dose (Sb)+Dose(B)

After completion of the source/drain and strain compensation implants, a rapid temperature anneal (RTA) process may be performed to activate the dopants. The RTA process may be performed at a temperature of between about 600° C. and about 1000° C., for a time period of up to 5 seconds. Of course, one or ordinary skill in the art will appreciate that these parameters may vary depending upon the desired dopant profile.

A conventional nickel salicide process (e.g., deposition of thin Ni films on the stress relieved source/drain regions 170a, 170b followed by a RTA process is performed to form conductive NiSi films 180a and 180b over the source/drain regions 170a, 170b as illustrated in FIG. 1C. Because the tensile stresses in the source/drain regions of the substrate have been reduced, the NiSi films 180a and 180b formed at these regions will be enhanced, i.e., at or close to a single phase of 100% pure NiSi. Hence, the formation of undesirable $NiSi_2$ at the source/drain regions will be substantially reduced or eliminated.

Figure 4A:
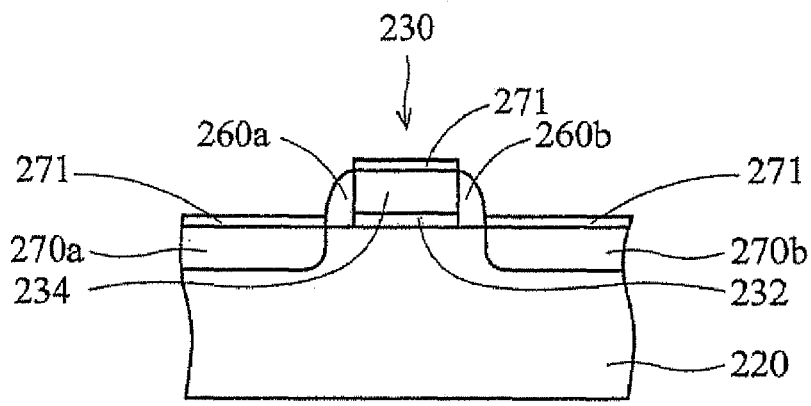
FIGS. 4A-4C are sectional views illustrating an alternate method of fabricating a PMOS semiconductor device according to the present invention.
Figure 4B:
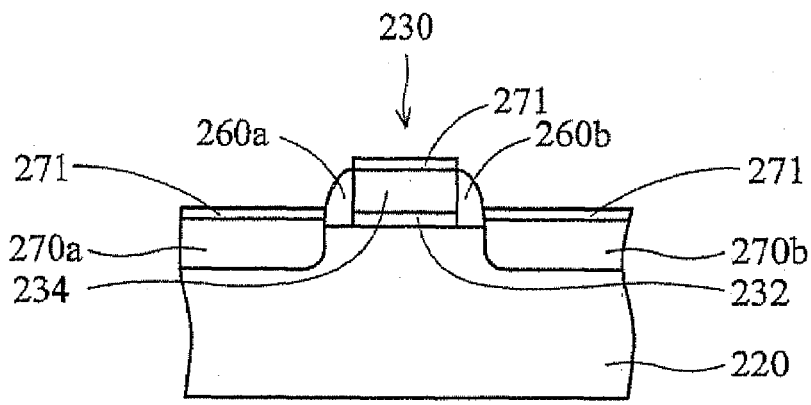
Figure 4C:
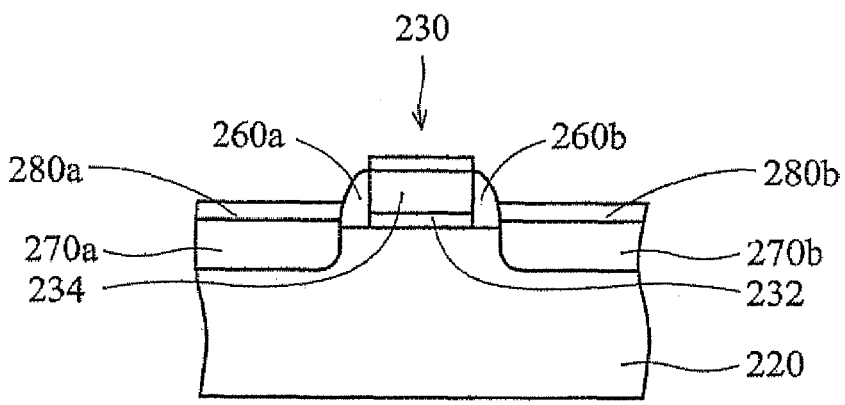

FIGS. 4A-4C are sectional views illustrating an alternate method of fabricating a PMOS semiconductor device according to the present invention. As illustrated in FIG. 4A, this method starts with a single crystal Si substrate 220 (or any substrate containing Si) including a gate structure 230 formed by a gate oxide 232 and a gate conductor 234, spacers 260a and 260b, source/drain regions 270a and 270b.

In accordance with the present invention, a layer 271 of amorphous Si (a-Si) is deposited over the source/drain regions 270a and 270b, or partially replaces the source/drain regions 270a and 270b, i.e., the top portions of the source/drain regions 270a and 270b become amorphous after this process. In some embodiments, an additional amorphorization implant followed by an RTA process may then be performed to maintain the source/drain regions 270a and 270b. The a-Si layer 271 may also be formed over the source/drain regions 270a and 270b during the source/drain implantation process, i.e., the source/drain implantation typically results in the formation of an a-Si layer which is recovered by RTA or may be formed by an additional amorphorization implantation right before nickel film deposition. The thickness of the a-Si layer 271 may be adjusted to a desired thickness by an appropriate implantation conditions such as dopants, dose, energy, temperature and current. The desired thickness of the amorphous layer may also be achieved by reducing the anneal temperature of the subsequent source/drain dopant activation RTA process, as illustrated in FIG. 4B. The reduced anneal temperature partially crystallizes the a-Si layer 271 up from the Si substrate side, thereby reducing the thickness of the a-Si layer 271 on the surface of the substrate to the desired thickness. In one embodiment, the reduced anneal temperature may be about 700° C. (reduced from a typical ~1000° C. anneal temperature). The desired thickness of the a-Si layer 271 depends upon the thickness of the nickel film to be deposited further on during silicidation, as the nickel films will consume a certain percentage of the a-Si layer 271 to form NiSi. Typically, a nickel film of a given thickness will consume an a-Si layer of 1.8 times of the given thickness during silicidation to form NiSi. Therefore, in a typical embodiment of the invention, the ratio of the thickness of the Ni films to the desired thickness of the a-Si layer may be about 1:1.8.

FIG. 4C illustrates the silicidation process described immediately above which forms NiSi films 280a and 280b over the source/drain regions 270a, 270b. Silicidation may be performed using conventional RTA parameters for nickel silicide. Generally, the silicidation process only consumes the remaining portion of the a-Si layer. Thus, the NiSi films 280a and 280b formed at the source/drain regions are enhanced because the stress induced formation of undesirable $NiSi_2$ at the source/drain regions has been substantially prevented by use of the a-Si layer 271 during silicidation (as long as layer 271 is a-Si substrate, the stress will not impact the silicide formation as it does single crystal Si).

Figure 5A:
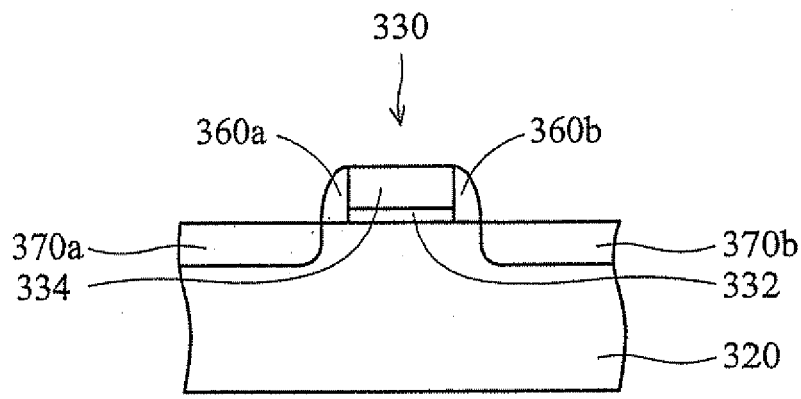
FIGS. 5A-5C are sectional views illustrating another method of fabricating a PMOS semiconductor device according to the present invention.
Figure 5B:
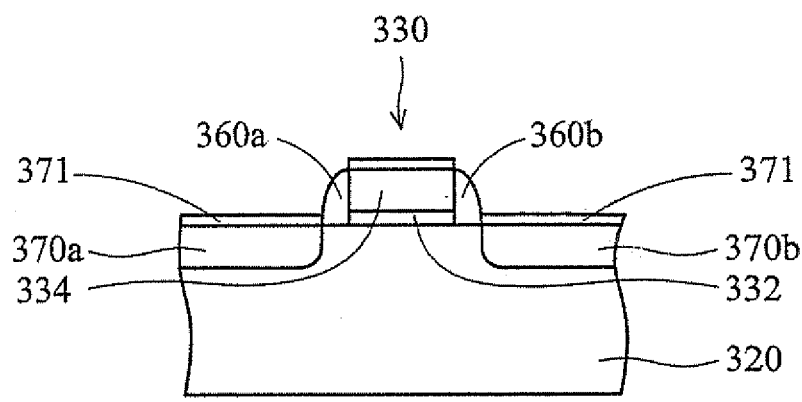
Figure 5C:
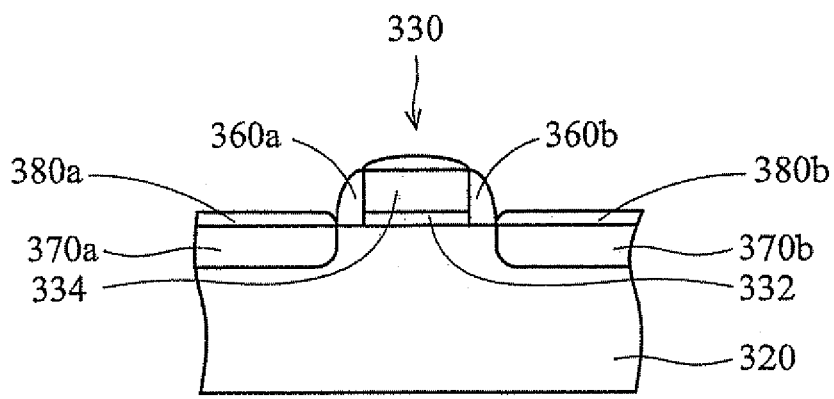

FIGS. 5A-5C are sectional views illustrating another method of fabricating a PMOS semiconductor device according to the present invention. As illustrated in FIG. 5A, this method starts with a single crystal Si substrate 320 (or any substrate containing Si) including a gate structure 330 formed by a gate oxide 332 and a gate conductor 334, spacers 360a and 360b and source/drain regions 370a and 370b in the substrate.

In accordance with the present invention, an a-Si layer 371 is deposited over the substrate to a desired thickness, depending upon the thickness of the nickel film to be deposited further on during silicidation, as illustrated in FIG. 5B. The a-Si layer 371 may be deposited using a conventional chemical vapor deposition process. The desired thickness of the a-Si layer 371 also depends upon the thickness of the nickel film to be deposited further on during silicidation, as discussed above in the previous embodiment. Therefore, in a typical embodiment of the invention, the ratio of the thickness of the Ni films to the desired thickness of the a-Si layer may be about 1:1.8.

FIG. 5C illustrates the silicidation process described immediately above which forms NiSi films 380a and 380b over the source/drain regions 370a, 370b. The silicidation may be performed using conventional RTA parameters for nickel silicide. As in the method of FIGS. 4A-4C, the silicidation process consumes the a-Si layer 371 instead of the tensile stressed epi-Si/single crystal Si, substrate. Consequently, the NiSi films 380a and 380b formed at the source/drain regions 370a, 370b are enhanced because the stressed induced formation of undesirable $NiSi_2$ at the source/drain regions has been substantially prevented by use of the a-Si layer 271 during silicidation.

Figure 6A:
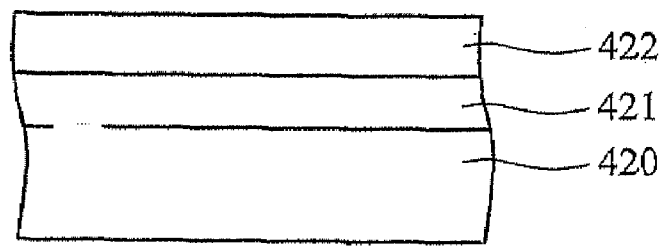
FIGS. 6A-6C are sectional views illustrating still another method of fabricating a PMOS semiconductor device according to the present invention.
Figure 6B:
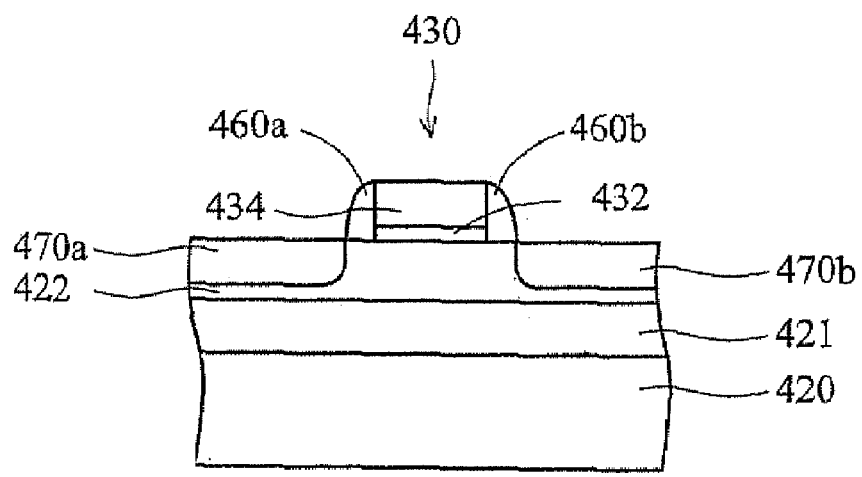
Figure 6C:
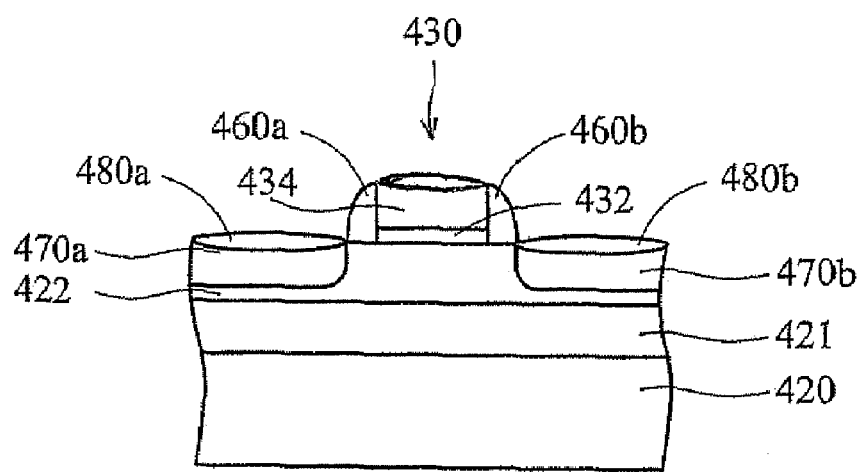

FIGS. 6A-6C are sectional views illustrating still another method of fabricating a MOS semiconductor device according to the present invention. As illustrated in FIG. 6A, the method commences with the formation of a buried layer in a p- or n-type Si substrate or any substrate containing Si. The buried layer should have a lattice constant that is larger than the lattice constant of the Si. For example, buried layers composed of Ge, SiGe, or $SiO_2$ have lattice constants larger than Si. As illustrated in FIG. 6A, the buried layer may be formed by epitaxially growing the buried layer 421 on the substrate 420 and then forming a layer 422 of Si over the buried layer 421. The Si layer 422 may be formed using a conventional CVD process. Since the buried layer 421 has a lattice constant which is greater than Si, the Si layer 422 will be placed in stress.

As illustrated in FIG. 6B, a gate structure 430, including a gate oxide 432 and a gate conductor 434, is formed over Si layer 422 followed by the formation of first and second non-conductive spacers 460a, 460b along opposing side walls of the gate structure 130. The gate structure 430 and spacers 460a, 460b may be similar to the gate and spacer structures described earlier with respect to FIG. 1A.

As further illustrated in FIG. 6B, a conventional source/drain implantation process may then be performed using a p-type dopant such as B and $BF_2$ to form self-aligned first and second p+ source/drain regions 470a, 470b in the Si layer 422. Since the B atoms have atomic radii that are smaller than Si, the underlying buried film 421 compensates or nulls the tensile stresses caused by B implant or other process parameters.

Conventional RTA and nickel silicidation processes may be performed to respectively activate the dopants and form conductive NiSi films 480a and 480b over the source/drain regions 470a, 470b as illustrated in FIG. 6C. Because the tensile stresses in the source/drain regions of the Si layer 422 have been substantially reduced or eliminated by the buried layer 422, the NiSi films 180a and 180b formed at these regions will be enhanced because the formation of undesirable $NiSi_2$ at the source/drain regions will be substantially reduced or eliminated. Even if a small quantity of undesired $NiSi_2$ is formed, the underlying buried layer 421 will prevent $NiSi_2$ from forming deeper below the depth of the buried layer.

Figure 7A:
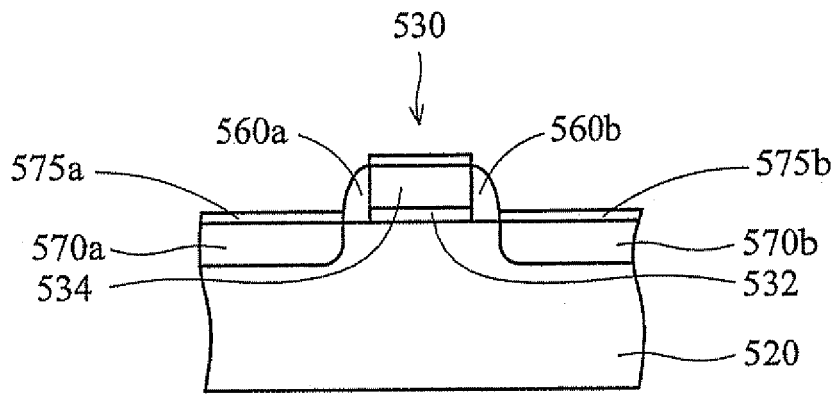
FIGS. 7A-7C are sectional views illustrating yet another method of fabricating a PMOS semiconductor device according to the present invention.
Figure 7B:
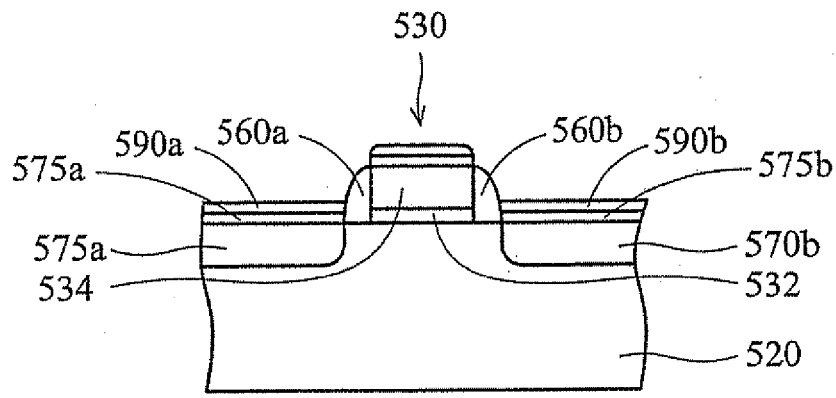
Figure 7C:
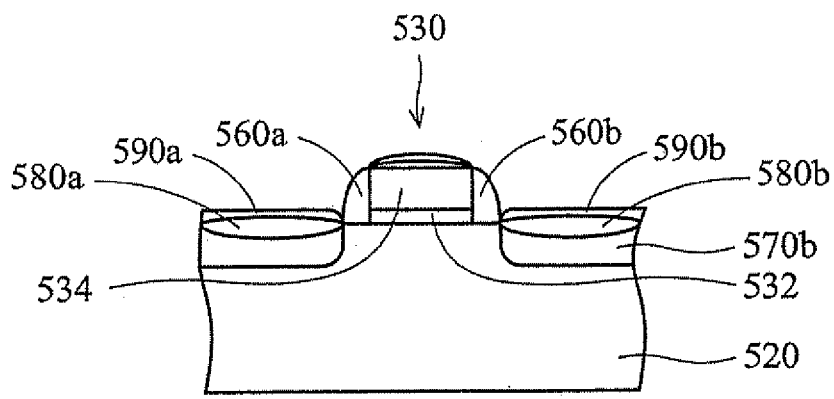

FIGS. 7A-7C are sectional views illustrating yet another method of fabricating a MOS semiconductor device according to the present invention. As illustrated in FIG. 7A, the method may commence with a single crystal Si substrate 520 (or any substrate containing Si) including a gate structure 530 formed by a gate oxide 532 and a gate conductor 534, dielectric spacers 560a and 560b, tensile-stressed p+ source/drain regions 570a and 570b in the substrate and nickel films 575a and 575b, for silicidation, disposed over the source/drain regions 570a and 570b, respectively.

As illustrated in FIG. 7B, dielectric capping layers 590a and 590b composed of nitride, oxide or oxynitride may be formed over the nickel films 575a and 575b, respectively. The dielectric spacers 560a and 560b and/or the dielectric capping layers 590a and 590b may be formed under tensile stress. The dielectric capping layers 590a and 590b should be composed of a material which places the Si substrate 575a and 575b in compression such as nitride. The compression provided by dielectric capping layers 590a and 590b compensates or nulls the tensile stresses in the underlying nickel films 575a and 575b.

As illustrated in FIG. 7C, a conventional RTA process may be performed to convert the nickel films 575a and 575b to NiSi films 580a and 580b, respectively. The RTA parameters such as temperature and duration and the thickness of the nickel films 575a and 575b and the thickness of the cap layers 590a and 590b and spacers 560 and 560b are adjusted as required to counter-act the tensile stresses in the source/drain regions 570a, 570b of the substrate 520.

Because the tensile stresses in the nickel films 575a and 575b have been substantially reduced by the counter-acting compressive stress applied by the cap layers 590a and 590b and/or spacers 560a and 560b (the source/drain extension is under the spacers), the formation of undesirable $NiSi_2$ at the source/drain regions during silicidation will be substantially reduced or eliminated. After silicidation, the cap layers 590a and 590b may be removed using a conventional removal process such as dry etching or wet ecthing.

Figure 8A:
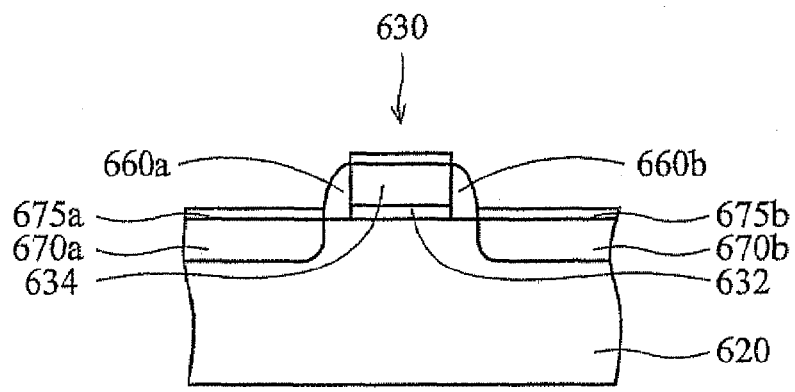
FIGS. 8A-8C are sectional views illustrating yet another method of fabricating a PMOS semiconductor device according to the present invention.
Figure 8B:
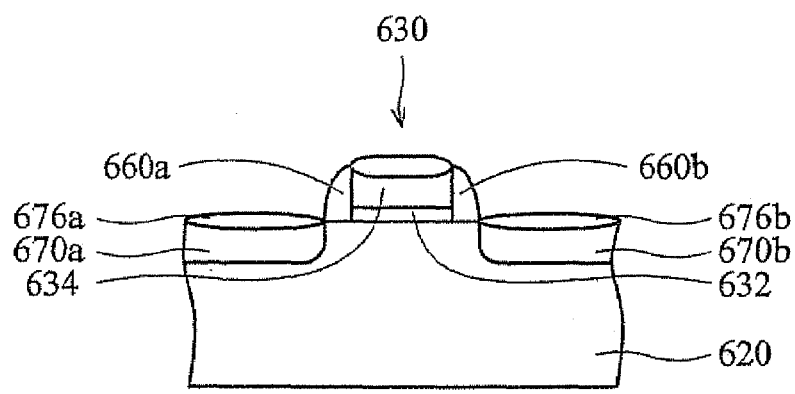
Figure 8C:
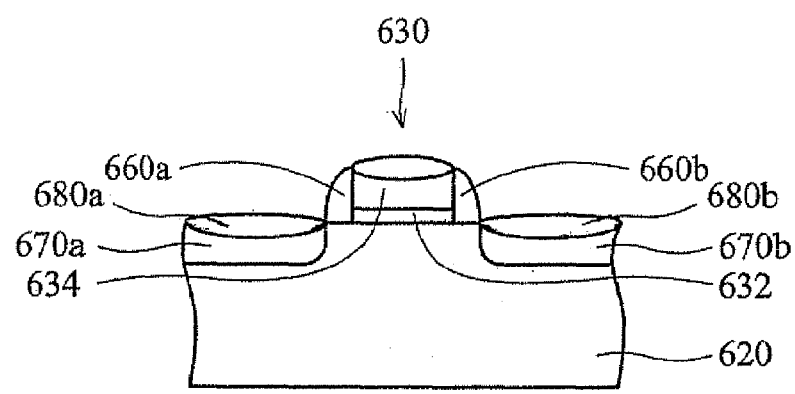

FIGS. 8A-8C are sectional views illustrating yet another method of fabricating a PMOS semiconductor device according to the present invention. As illustrated in FIG. 8A, the method may commence with a single crystal Si substrate 620 (or any substrate containing Si) including a gate structure 630 formed by a gate oxide 632 and a gate conductor 634, spacers 660a and 660b, tensile-stressed p+ source/drain regions 670a and 670b in the substrate and nickel films 675a and 675b, for silicidation, disposed over the source/drain regions 670a and 670b, respectively.

A two cycle RTA process is then performed to convert the nickel films 675a and 675b to NiSi films. As illustrated in FIG. 8B, the first cycle of the RTA process is performed to convert the nickel films 675a and 675b to metal-rich silicide ($Ni_2Si$) films 676a an 676b. In one embodiment, the first cycle may be performed at a temperature ranging from about 200° C. to about 220° C. for about 10 seconds to about 20 minutes. The low temperature of the first RTA cycle prevents the formation of $NiSi_2$, which forms easily between about 250° C. and about 400° C.

As illustrated in FIG. 8C, the second cycle of the RTA process is performed to convert the $Ni_2Si$ films 676a and 676b to NiSi films 680a and 680b. In one embodiment, the second cycle of the RTA process may be performed at a temperature of about 375 to about 425° C. for about 10 to about 20 seconds. If desired, the second cycle of the RTA process can be implemented during the subsequent deposition of an etch stop layer, which is typically performed at a deposition temperature of about 400° C.

Figure 9A:
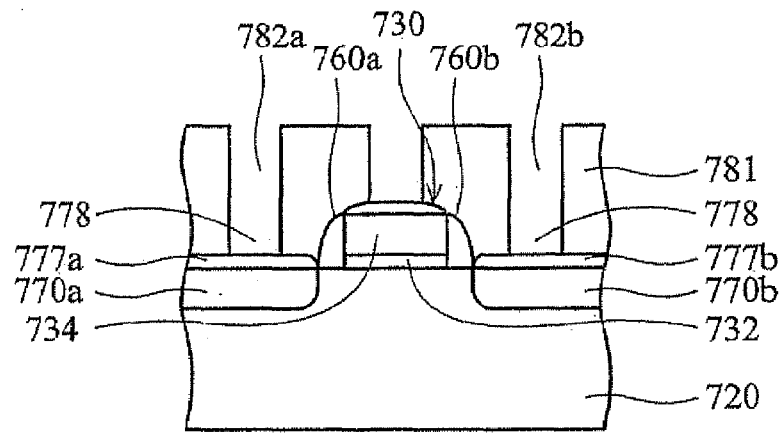
FIGS. 9A-9C are sectional views illustrating yet another method of fabricating a PMOS semiconductor device according to the present invention.
Figure 9B:
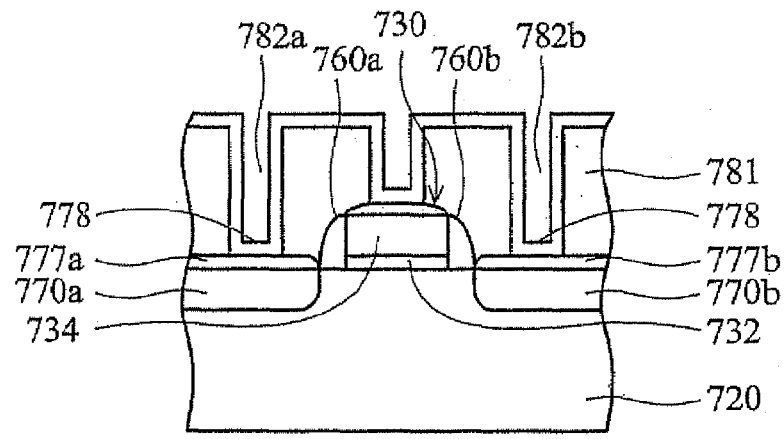
Figure 9C:
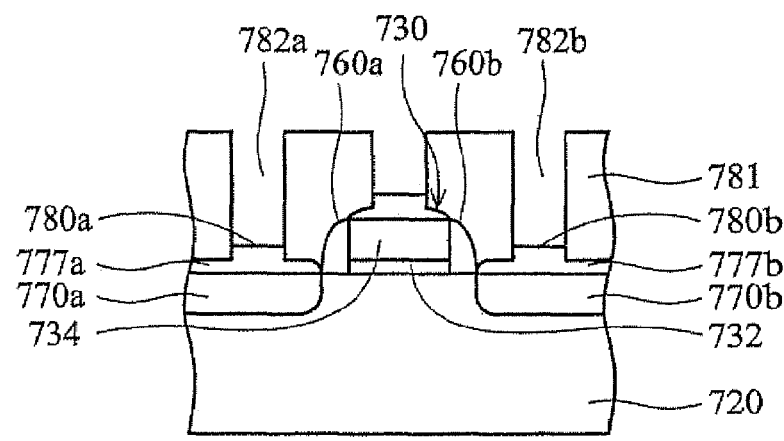

FIGS. 9A-9C are sectional views illustrating yet another method of fabricating a PMOS semiconductor device according to the present invention. As will become apparent further on, this method of the invention may be used as a repair process when $NiSi_2$ has formed thereby causing higher contact resistance. As illustrated in FIG. 9A, the method may commence with a Si substrate 720 including a gate structure 730 formed by a gate oxide 732 and a poly-Si gate conductor 734, spacers 760a and 760b, source/drain regions 770a and 770b in the substrate 720, $NiSi_2$ films 777a and 777b disposed over source/drain regions 770a and 770b, an interlayer dielectric 781 disposed over the $NiSi_2$ films 777a and 777b and contact holes 782a and 782b etched through to respective $NiSi_2$ films 777a and 777b.

As illustrated in FIG. 9B, an additional Ni deposition is performed to form a layer 778 of Ni over the $NiSi_2$ films 777a and 777b. Typically, the thickness range of the additional nickel is about 20 anstroms to about 40 angstroms. A conventional RTA process is then performed to convert the $NiSi_2$ films 777a and 777b to a NiSi films 780a and 780b, and any unreacted Ni that may be remaining after RTA may then be conventionally removed, as illustrated in FIG. 9C.

While the foregoing invention has been described with reference to the above, various modifications and changes can be made without departing from the spirit of the invention. Accordingly, all such modifications and changes are considered to be within the scope of the appended claims.

What is claimed is:

1. A method of fabricating a semiconductor device, the method comprising the steps of:
    providing a substrate;
    doping a silicon or silicon containing region of the substrate with a first dopant, the first dopant creating a stress in the region;
    doping the region with a second dopant that reduces stress in the region caused by the first dopant, the region with the first and second dopants comprising a source/drain region; and
    forming a nickel mono-silicide film on the source/drain region.

2. The method according to claim 1, wherein the second dopant has atoms with an atomic radii greater than the atomic radius of the silicon atom.

3. The method according to claim 1, wherein the doping step using the first dopant is performed to reach a specified active carrier concentration.

4. The method according to claim 3, wherein the second dopant in the source/drain region reduces the stress of the silicon in the region while maintaining the specified active carrier concentration achieved by the first dopant.

5. The method according to claim 1, wherein the second dopant is selected from the group consisting of group II elements, group III elements, group IV elements, and combinations thereof.

6. The method according to claim 1, wherein prior to the nickel mono-silicide forming step further comprising the step of activating the first and second dopants in the source/drain region.

7. A method of fabricating a semiconductor device, the method comprising the steps of:
    providing a substrate;
    doping a silicon or silicon containing region of the substrate with a dopant to form a source/drain region, the dopant causing a tensile stress in the region of the substrate;
    forming a nickel film on the region;
    forming a capping layer on the nickel film, the capping layer being selected from a material that compresses the nickel film and the underlying region; and
    converting the nickel film to a nickel mono-silicide film.

8. The method according to claim 7, further comprising the step of removing the capping layer.

9. The method according to claim 7, wherein the capping layer comprises a dielectric material.

10. The method according to claim 7, wherein the converting step is performed by annealing the substrate.

* * * * *